(12) United States Patent
Passaniti et al.

(10) Patent No.: US 11,747,908 B2
(45) Date of Patent: Sep. 5, 2023

(54) SYSTEM AND METHOD FOR CONTROLLING A FUNCTIONALITY OF A DEVICE BASED ON A USER GESTURE

(71) Applicant: STMicroelectronics S.r.l., Agrate Brianza (IT)

(72) Inventors: Fabio Passaniti, Syracuse (IT); Enrico Rosario Alessi, Catania (IT)

(73) Assignee: STMICROELECTRONICS S.R.L, Agrate Brianza (IT)

( * ) Notice: Subject to any disclaimer, the term of this patent is extended or adjusted under 35 U.S.C. 154(b) by 224 days.

(21) Appl. No.: 17/237,754

(22) Filed: Apr. 22, 2021

(65) Prior Publication Data

US 2021/0357035 A1     Nov. 18, 2021

(30) Foreign Application Priority Data

May 15, 2020 (IT) .................. 102020000011221

(51) Int. Cl.
  *G09G 5/00* (2006.01)
  *G06F 3/01* (2006.01)
  (Continued)

(52) U.S. Cl.
  CPC ............. *G06F 3/017* (2013.01); *G01R 29/12* (2013.01); *G06F 3/011* (2013.01); *H04N 23/60* (2023.01);
  (Continued)

(58) Field of Classification Search
  CPC ...... G06F 3/017; G06F 3/011; G06F 2218/12; G01R 29/12; G01R 29/24; H04N 23/60;
  (Continued)

(56) References Cited

U.S. PATENT DOCUMENTS 5,844,415 A     12/1998   Gershenfeld et al.
11,511,154 B1 *  11/2022   Chuang .................. G01P 13/00
                          (Continued)

FOREIGN PATENT DOCUMENTS

EP       2980609 A1     2/2016
KR    20110061750 A     6/2011

OTHER PUBLICATIONS

Kurita, Koichi, "Development of Non-Contact Measurement System of Human Stepping", SICE Annual Conference, The University Electro-Communications, Japan, Aug. 20-22, 2008, 4 pages.

*Primary Examiner* — Thuy N Pardo
(74) *Attorney, Agent, or Firm* — Slater Matsil, LLP

(57) ABSTRACT

An embodiment method for controlling at least one functionality of an electronic device on the basis of a gesture of a user comprises detecting, by a sensor, a variation of electrostatic charge of the user during the execution of the gesture and generating a charge variation signal. The gesture includes moving at least one foot upward and, subsequently, downward. The method further includes, by a processing unit, acquiring the charge variation signal, detecting, in the charge variation signal, a characteristic identifying the gesture of moving the foot upward, detecting, in the charge variation signal, a characteristic identifying the gesture of moving the foot downward, and controlling the functionality of the electronic device only in the event that both the first and the second characteristics have been detected.

20 Claims, 7 Drawing Sheets

(51) Int. Cl.
*G01R 29/12* (2006.01)
*H04N 23/60* (2023.01)
*G06N 20/00* (2019.01)
*G06N 5/04* (2023.01)

(52) U.S. Cl.
CPC ............ *G06F 2218/12* (2023.01); *G06N 5/04* (2013.01); *G06N 20/00* (2019.01)

(58) Field of Classification Search
CPC ........ G06N 5/04; G06N 20/00; H03K 17/955; H04M 2250/12; H04M 1/72403
USPC ............ 345/156, 173, 174, 655, 108, 440.1; 715/274; 704/211
See application file for complete search history.

(56) References Cited

U.S. PATENT DOCUMENTS

| | | |
|---|---|---|
| 2011/0159864 A1 | 6/2011 | Park et al. |
| 2011/0199393 A1* | 8/2011 | Nurse .................... G06F 3/017 345/665 |
| 2012/0004523 A1 | 1/2012 | Richter et al. |
| 2013/0187704 A1 | 7/2013 | Edwards |
| 2014/0232516 A1 | 8/2014 | Stivoric et al. |
| 2015/0042602 A1* | 2/2015 | Kim ........................ G06F 3/033 345/174 |
| 2015/0049055 A1* | 2/2015 | Post ........................ H03K 17/96 345/173 |
| 2015/0106706 A1* | 4/2015 | Jeong .................... G06F 3/0482 715/274 |
| 2015/0287422 A1* | 10/2015 | Short ........................ G01S 3/74 704/211 |
| 2015/0317810 A1* | 11/2015 | Grunwald .............. A61B 5/352 345/440.1 |
| 2016/0366266 A1* | 12/2016 | Chung .............. H04M 1/72412 |
| 2017/0196500 A1* | 7/2017 | Wysoski ................ A61B 5/087 |
| 2017/0238847 A1* | 8/2017 | Inan ...................... A61B 5/02125 |
| 2017/0336870 A1* | 11/2017 | Everett ................... G06F 3/017 |
| 2019/0175077 A1* | 6/2019 | Zhang .................... G06F 3/017 |
| 2019/0302901 A1* | 10/2019 | Tian .................... G06F 3/04883 |
| 2020/0004324 A1* | 1/2020 | Perlin .................... G06F 3/0334 |
| 2020/0058316 A1* | 2/2020 | Short ........................ H04R 3/00 |
| 2020/0341544 A1* | 10/2020 | Perlin .................... G06F 3/017 |
| 2020/0367810 A1* | 11/2020 | Shouldice ............ A61B 5/4818 |
| 2021/0041956 A1* | 2/2021 | Hasburgh ................ G06F 3/017 |
| 2021/0157414 A1* | 5/2021 | Maani .................... G06F 3/017 |
| 2022/0300087 A1* | 9/2022 | Levesque ................ G06F 3/017 |
| 2022/0415000 A1* | 12/2022 | Booth .................... G06V 20/20 |

\* cited by examiner

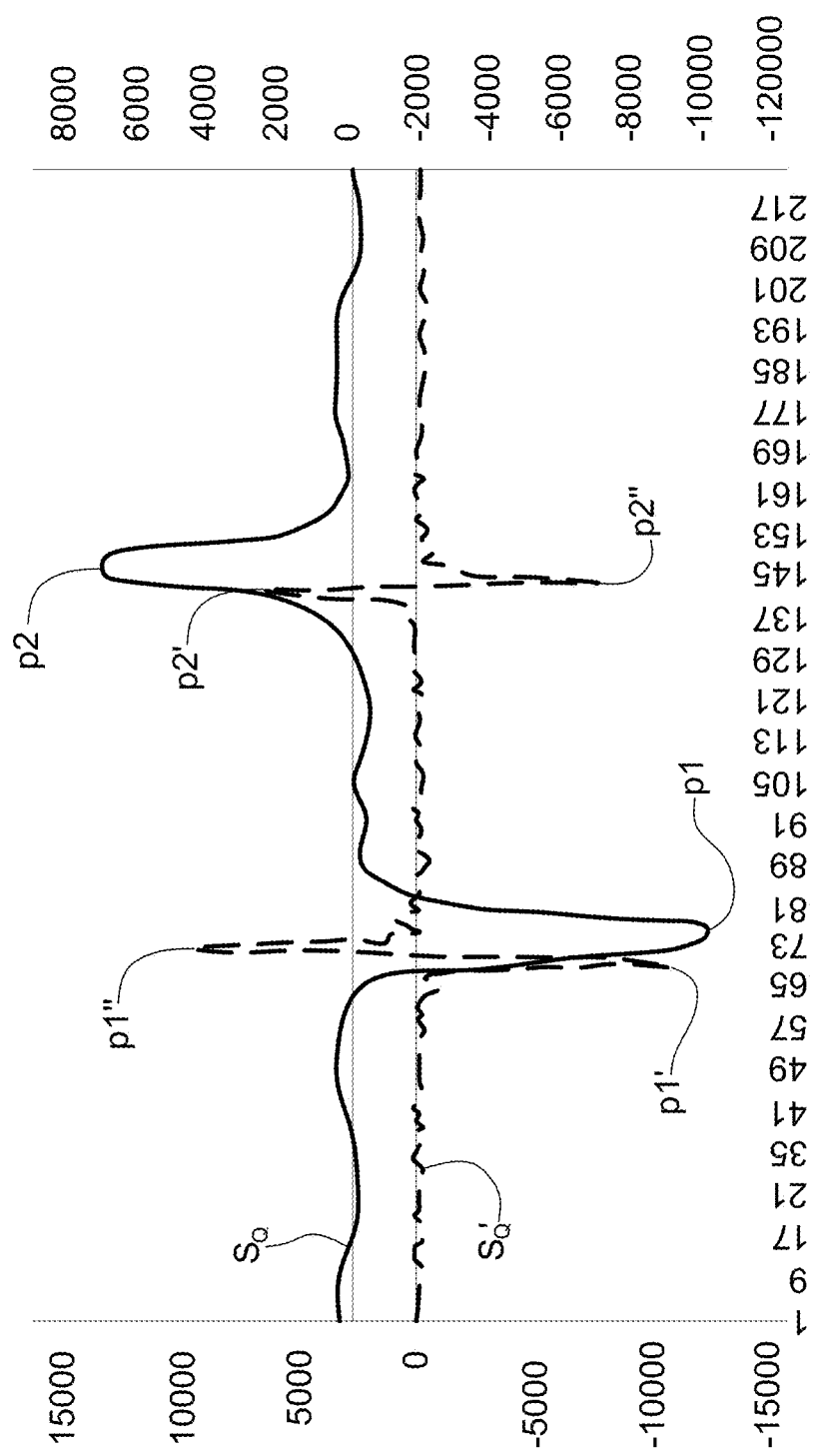

SYSTEM AND METHOD FOR CONTROLLING A FUNCTIONALITY OF A DEVICE BASED ON A USER GESTURE

CROSS-REFERENCE TO RELATED APPLICATIONS

This application claims priority to Italian Patent Application No. 102020000011221, filed on May 15, 2020, which application is hereby incorporated herein by reference.

TECHNICAL FIELD

Embodiments of the present invention relate to a system and a method for controlling at least one functionality of an electronic device based on a gesture of a user of the electronic device.

BACKGROUND

Devices used for the continuous monitoring of a user's body in the environment and during free living conditions are known. Various sensors, for example for detecting the acceleration, the electrical resistance of the skin, the temperature of the skin, the radiated heat flow and the heart rate, are used in various combinations to determine or derive parameters such as calorie burn rate, type and level of activity and sleep status. These devices employ sophisticated algorithms to integrate various acquired data flows, in order to determine output parameters with the best possible precision (e.g., calories burned, type of physical activity, etc.). Additional sensors, to detect additional parameters, provide algorithms with additional data, to improve their accuracy.

In particular, as regards the step counting, the use of triaxial accelerometers (often integrated in portable devices) is known for providing an acceleration signal along three orthogonal axes, and processing the acceleration signal by means of step recognition algorithms in order to identify specific signal patterns that may be related to the execution of a step by the user. However, the acceleration signal processing is calibrated on an "average" or "standard" user and does not take into account specific physical conditions or needs (even if only temporary) that may arise. For example, due to physical problems, the user might take very short steps, or with a different pace from that of the average user taken as a reference in the calibration of the recognition algorithm. Or, the movement of the arms, used by software installed on board wearable devices (e.g., smartwatches), may not be indicative of a step in the event that the user has problems in the movement of the same. Other unpredictable conditions may also prevent a correct step counting.

Electric field sensors are used in alternative or in addition to accelerometer sensors for determining a user's activity, or for helping interpret the signals generated by other sensor devices.

An electric charge is a fundamental component of nature. The electrons of an element are easily transferred to another element in conditions of direct contact between the elements or at a distance. When the charge is transferred between two electrically insulated objects, a static charge is generated whereby the object with an excess of electrons is negatively charged and the object with a deficiency of electrons is positively charged.

Electrons move within an object in different ways depending on whether the object is a conducting or insulating object. In a conductor, electrons are more or less evenly distributed throughout the material and may easily move based on the influence of external electric fields. In an insulator, the charge mainly exists on the surface. The charge may however be movable, depending on the properties of the material and other environmental factors.

Devices detecting the variation of the electric field generated by a man during the movements of the same, or exploiting a capacitive-type detection are known. Technologies using the latter type of detection include, for example, touch screens, systems for detecting the occupant position in automobiles, and devices for determining the position, the orientation and the mass of an object, such as, for example, described in patent document U.S. Pat. No. 5,844,415 regarding an electric field detection device for determining the position, the mass distribution and the orientation of an object within a defined space, arranging a plurality of electrodes within the defined space. This technical solution could also be used to recognize a user's gestures, hand position and orientation, for example for interactive use with a processing system, in place of a mouse or a joystick.

Patent document US2014/0232516 proposes the use of an electrostatic charge sensor to derive a physiological parameter or a user's activity, such as walking, cycling or energy consumption from a field or a capacitive sensor.

The scientific document by K. Kurita, "Development of Non-Contact Measurement System of Human Stepping", SICE Annual Conference 2008, Japan, illustrates a system and a method for counting the steps taken by a subject exploiting a contactless technique. This technique provides for detecting the electrostatic induction current, generated as a direct consequence of the movement of the subject in the environment, through an electrode placed at a distance of 1.5 m from the subject. However, the experiment illustrated in this document is carried out under ideal conditions, and is a mere demonstration of the technology feasibility to step counting. This document does not teach a technique applicable in real life conditions, wherein the subject executes, in addition to steps, a plurality of other activities, each of which causes a variation of the electrostatic charge detected by the sensor. In these conditions, the detection of signal components due exclusively to the subject's steps is complex and does not guarantee high reliability on the accuracy of the detection and consequent counting.

SUMMARY

The need is therefore felt to make up for the shortcomings of the prior art by providing a system and a method for controlling at least one functionality of an electronic device based on a gesture of a user of the electronic device that is economical but reliable, and that requires a reduced computational load.

Embodiments of the present invention relate to a system and a method for controlling at least one functionality of an electronic device based on a gesture of a user of the electronic device. Embodiments of the present invention also relate to the electronic device which comprises the system. In particular, the gesture includes moving at least one foot upward and, subsequently, downward by the user, detecting as a consequence of this gesture a variation of the electrostatic charge of the user's body.

According to embodiments of the present invention, a system and a method for controlling at least one functionality of an electronic device based on a gesture of a user of the electronic device, and an electronic device that includes the system are provided, as defined in the attached claims.

BRIEF DESCRIPTION OF THE DRAWINGS

For a better understanding of the invention, embodiments thereof are now described, purely by way of non-limiting example and with reference to the attached drawings, wherein:

FIG. 6B exemplary illustrates the trend of the electric charge variation signal and the derivative thereof in the case of a slow upward and downward movement of a foot by the user.

DETAILED DESCRIPTION OF ILLUSTRATIVE EMBODIMENTS

Figure 1:
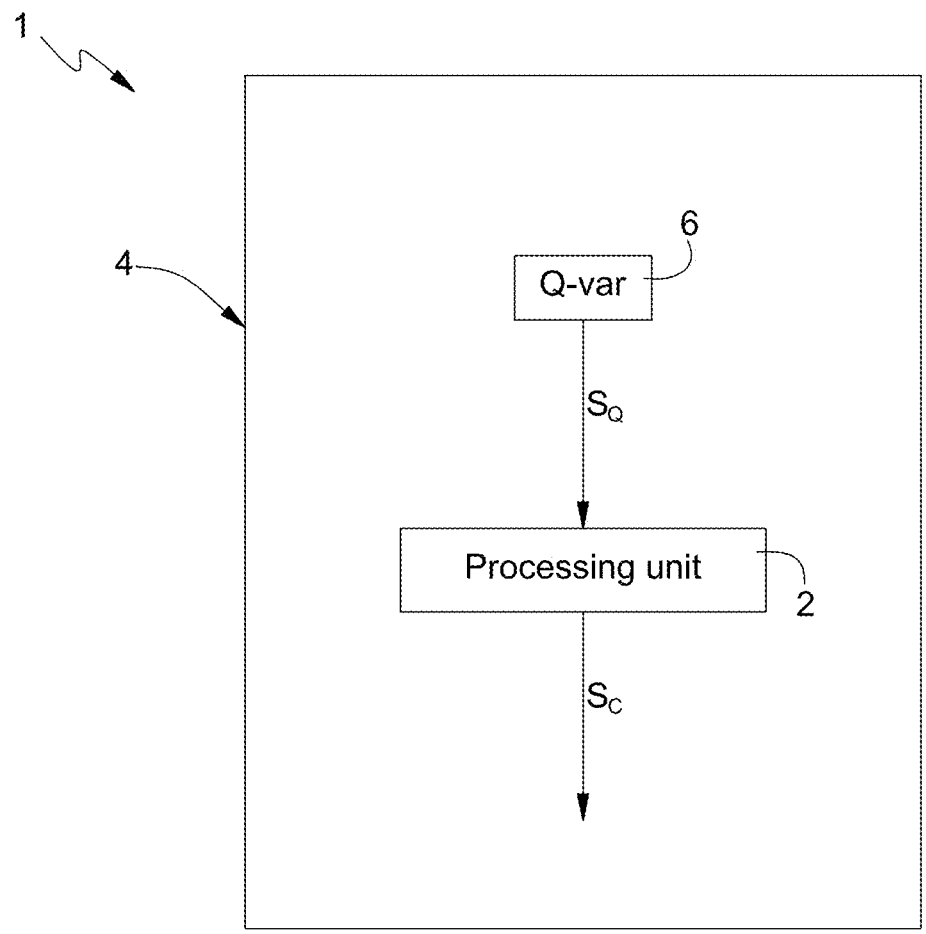
FIG. 1 schematically illustrates a system for controlling at least one functionality of an electronic device including an electrostatic electric charge variation sensor, according to an embodiment of the present invention.

FIG. 1 illustrates, schematically, a movement detection system 1 according to an aspect of the present invention. The movement detection system 1 comprises a processing unit 2 of an electronic device, or system, 4 and an electrostatic charge variation sensor 6 coupled to the processing unit 2. In one embodiment, the electrostatic charge variation sensor 6 is integrated in the device 4. The processing unit 2 receives a charge variation signal $S_Q$ from the electrostatic charge variation sensor 6 and generates, according to the charge variation signal $S_Q$, a command or control signal $S_C$.

The processing unit 2 implements, in use, a method for recognizing a gesture by a user of the device 4. The recognition of this gesture causes the generation of the command or control signal $S_C$, which is for controlling or commanding at least one functionality of the device 4 (for example, enabling or disabling a functionality).

Figure 2:
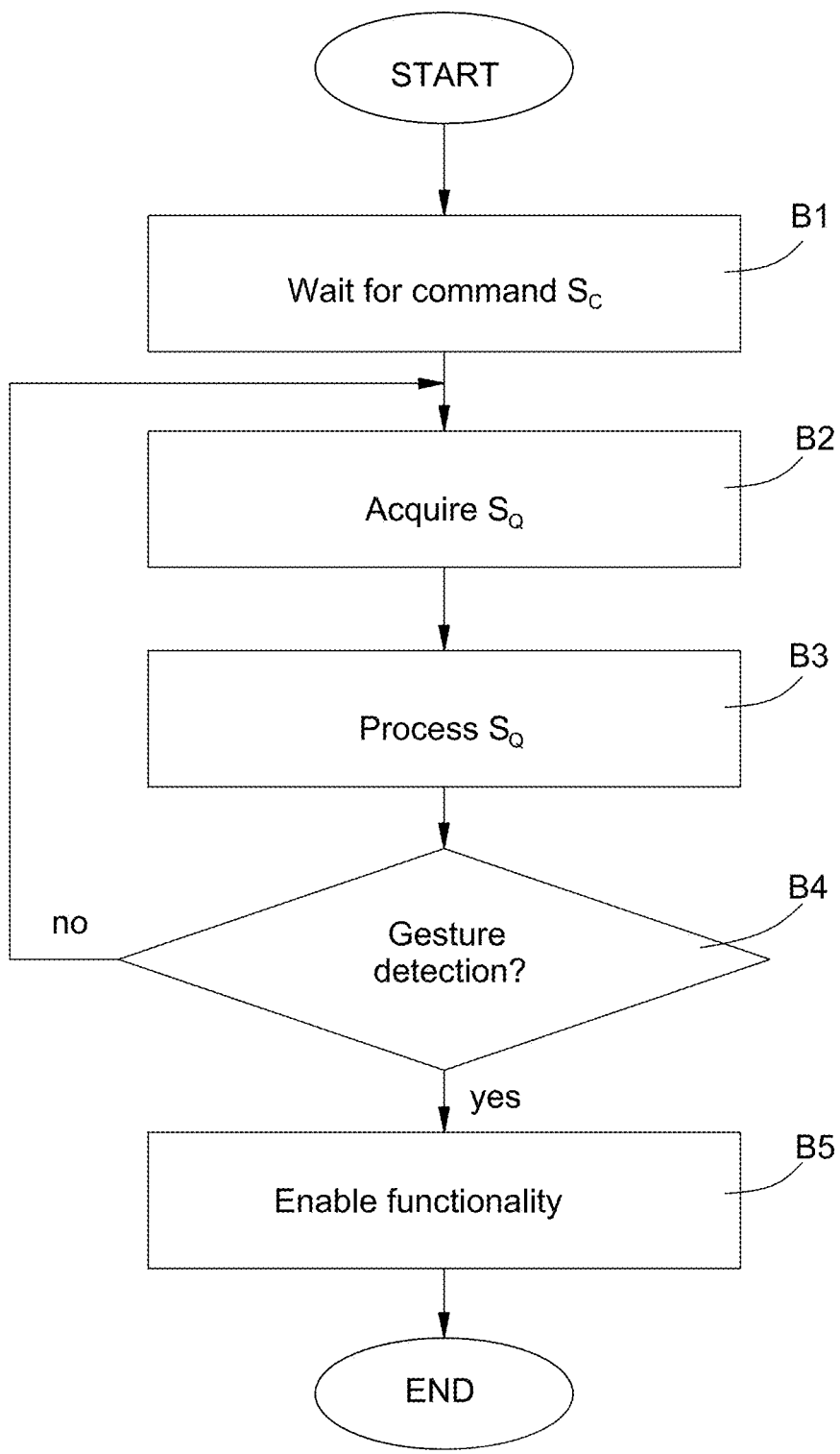
FIG. 2 illustrates, by means of a block diagram, a method for controlling at least one functionality of an electronic device, according to an embodiment of the present invention.

This method is represented by means of a block diagram in FIG. 2.

With reference to FIG. 2, block B1, the functionality to be controlled is considered off or disabled, waiting for the command signal $S_C$.

Then, block B2, a charge variation signal $S_Q$ generated by the electrostatic charge variation sensor 6 is acquired.

Then, block B3, a step of processing the charge variation signal $S_Q$ for extracting significant parameters and parameters identifying the gestures to be detected is carried out.

In the event that such gestures are detected, block B4, the aforementioned functionality of the device 4 is enabled (block B5); otherwise the method returns to block B2 by continuing the acquisition of the charge variation signal $S_Q$.

In one embodiment of the present invention, the gestures to be detected are the upward movement from the ground and the successive downward movement to the ground of at least one foot, or leg, of the user.

Each upward and downward movement generates a variation of electrostatic charge through the user's body, due to an exchange of charges with the ground/floor, which is detected by the electrostatic charge variation sensor 6. The sequence, within a predefined time, of upward and downward movements of the user's foot or leg identifies the intention of the user of enabling the aforementioned functionality of the device 4 and involves, therefore, the generation of the command signal $S_C$ which enables such functionality. These steps are an implementation of block B4, which therefore includes a sub-step of recognizing the upward movement of the foot or leg and, only in the positive case, the passage to a sub-step of recognizing the downward movement of the foot or leg within a first time interval. If the downward movement of the leg occurs within this time interval, then the method moves on to block B5; conversely it returns to block B2.

Byway of non-limiting example, the device 4 is a portable electronic device, such as a smartphone, and the functionality to be controlled is the taking of a photo (for example, in selfie mode) by means of a photo- or video-camera of the device 4.

The processing unit 2 is, in one embodiment, a microcontroller integrated in the device 4.

The movement detection system 1 has at least one sensitive element, or electrode (identified with the reference number 5 only in FIG. 3), with which a part of the user's body (e.g., hand or finger) may be placed in direct electrical contact. The electrode 5 may be integrated in the case of the device 4, or connected to the device 4 in another way, for example by means of an external cable or wireless connection (for example, integrated in a smartwatch connected to the device 4). Other embodiments are possible, as apparent to the skilled in the art, so that the electrode 5 is in electrical contact with a region of the user's body during the step of controlling and commanding the aforementioned functionality.

The sensitive element (electrode) 5 that collects the external charge may be a metal surface or an electrode coated with dielectric material or again a metal surface placed under the case of the device integrating it. In any case, in use, the user is required to place a finger (or hand, or other portion of the body) in contact with this sensitive element 5.

The movement detection system 1 is affected by the variation of electrostatic charge due to movements of the user. The signal deriving from specific movements (in particular, due to the upward and downward movements of a foot or leg) may be isolated and identified with respect to other movements that are not of interest and with respect to the background noise present in case of user inactivity. According to the present invention, however, it is assumed that the functionality is enabled starting from a condition of substantial stationarity of the user and therefore it is not necessary to carry out a recognition of shapes of the signal $S_Q$ to identify the shape deriving from the upward/downward movement of the foot or leg with respect, for example, to that deriving from a complex movement of the arms.

Figure 3:
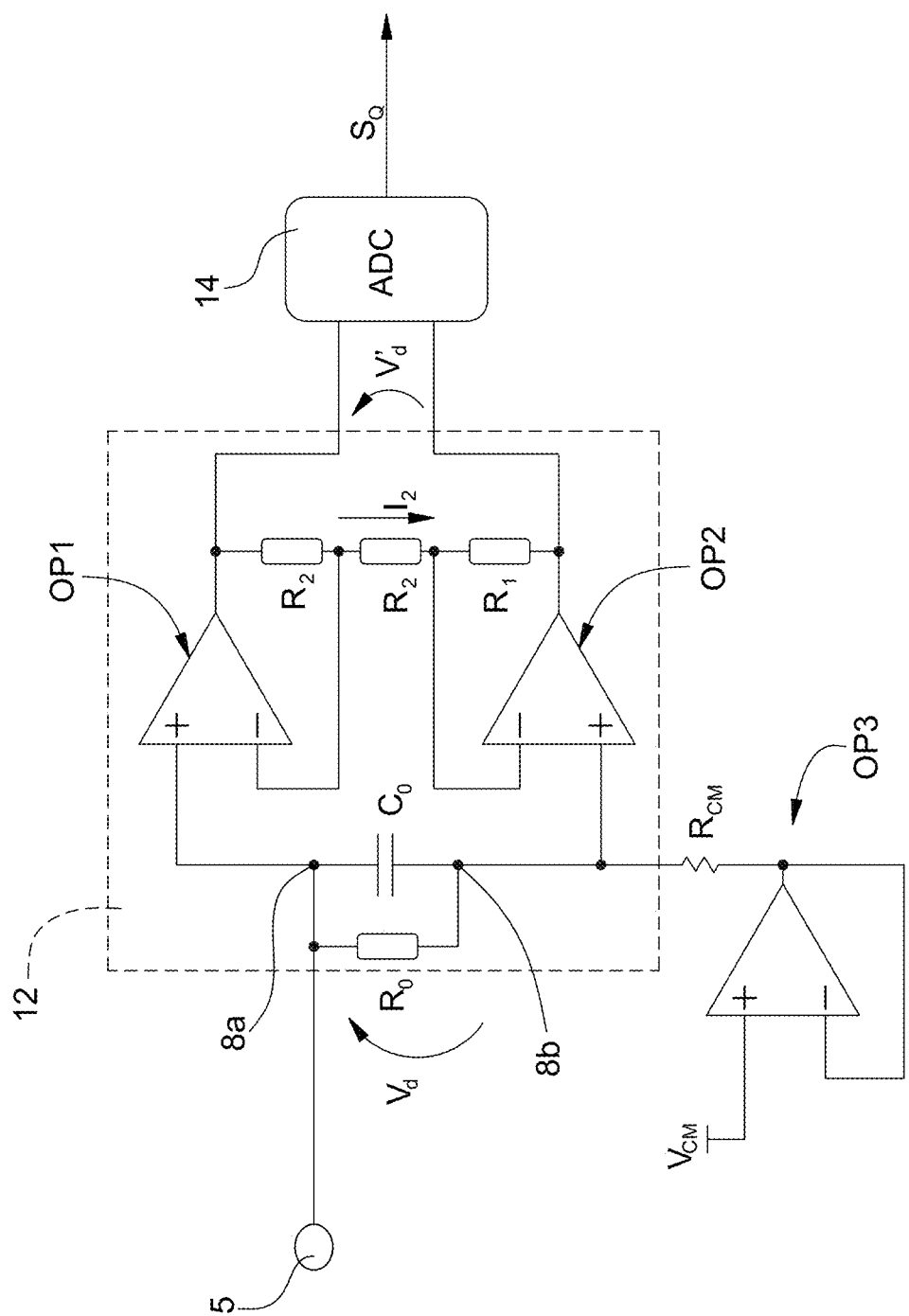
FIG. 3 illustrates an embodiment of the electric charge variation sensor of FIG. 1.

FIG. 3 illustrates an exemplary and non-limiting embodiment of an electrostatic charge variation sensor 6. The electrostatic charge variation sensor 6 comprises an input 8a, electrically coupled to the electrode 5 which, in turn, is contactable by a portion of a user's body; the electrostatic charge variation sensor 6 also comprises an input 8b, electrically coupled to the input 8a by means of a resistor Ro and a capacitor Co in parallel with each other. The pair Ro, Co, connected to the electrode 5 and placed between the two non-inverting inputs of the two operational amplifiers OP1 and OP2, has the function of accumulating the charges collected by the electrode 5 and of managing the band of the input signal (to filter signals and noises at unwanted frequency).

The values of the capacitance of Co and the resistance of Ro may be chosen according to the type of filter that it is desired to form, for example a low-pass filter, with a cut-off frequency of a few tens of Hz, for example 20 Hz. For example, the capacitance of Co is chosen in the range 5 pF-5 nF. For example, the resistance of Ro is chosen in the range 500 MOhm-50 GOhm. The values of the capacitance of Co and the resistance of Ro may also be chosen according to the impedance of the stage to which they are connected, the usable frequency of the signal Vd and that of the interferences to be filtered (e.g., frequency of the power grid, high frequency electrical noises of the power supply circuits, etc.).

The voltage (or electric potential) Vd that is established, in use, between the inputs 8a and 8b represents the differential input of an instrumentation amplifier 12.

The instrumentation amplifier 12 includes two operational amplifiers OP1 and OP2. A biasing stage (buffer) OP3 is used for biasing the instrumentation amplifier 12 to a common mode voltage $V_{CM}$.

The inverting terminals of the operational amplifiers OP1 and OP2 are connected to each other by means of a resistor $R_2$. As the two inputs of each operational amplifier OP1, OP2 are to be at the same potential, the input voltage Vd is also applied to the ends of $R_2$ and causes, through this resistor $R_2$, a current equal to $I_2 = Vd/R_2$. This current $I_2$ does not come from the input terminals of the operational amplifiers OP1, OP2 and therefore runs through the two resistors $R_1$ connected between the outputs of the operational amplifiers OP1, OP2, in series with the resistor $R_2$; the current $I_2$, therefore running through the series of the three resistors $R_1$-$R_2$-$R_1$, produces an output voltage Vd' given by Vd'=$I_2 \cdot (2R_1+R_2)$=Vd$\cdot(1+2R_1/R_2)$. Therefore, the overall gain of the circuit of FIG. 3 is Ad=$(1+2R_1/R_2)$. The differential gain depends on the value of the resistor $R_2$ and may therefore be modified by acting on the resistor $R_2$.

The differential output Vd', therefore being proportional to the potential Vd between the inputs 8a, 8b, is input to an analog-to-digital converter 14, which outputs the charge variation signal $S_Q$ for the processing unit 2. The charge variation signal $S_Q$ is, for example, a high-resolution digital stream (16 bits or 24 bits). The analog-to-digital converter 14 is optional, since the processing unit 2 may be configured to work directly on the analog signal, or may itself comprise an analog-to-digital converter for converting the signal Vd'.

Figure 4A:
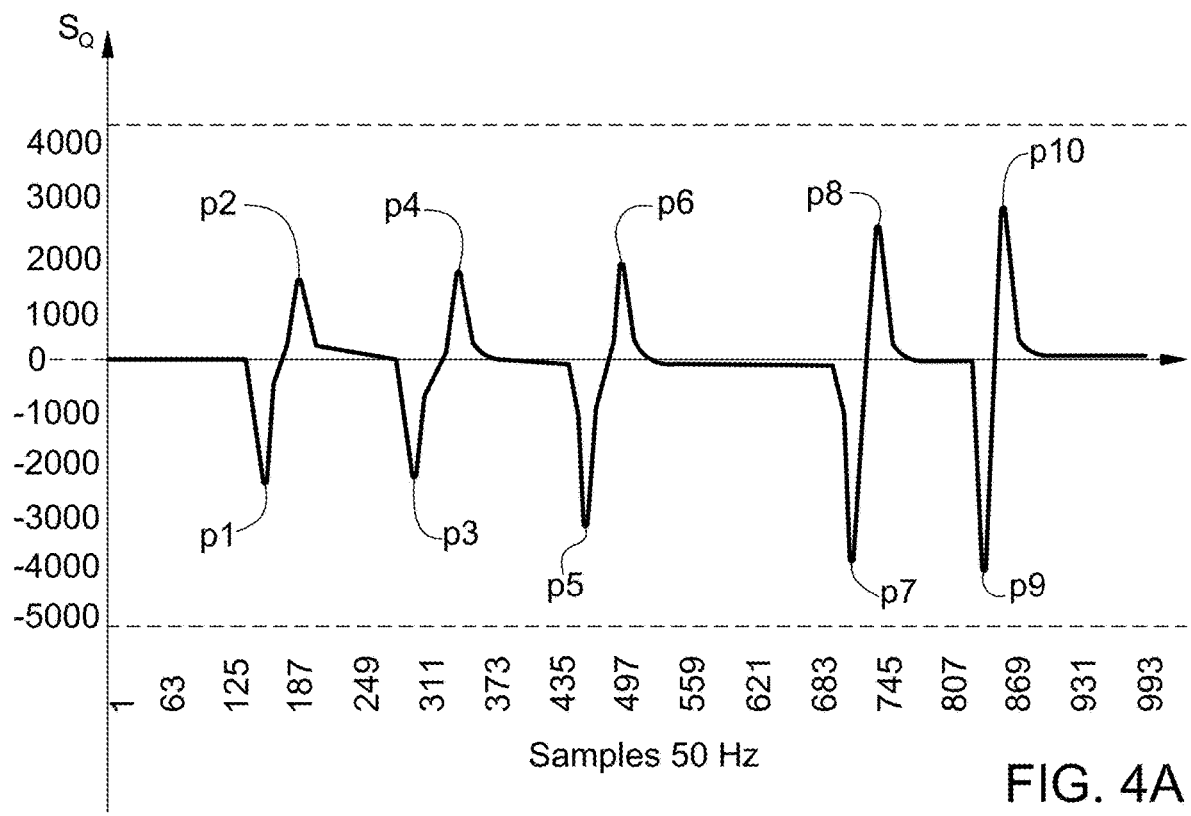
FIG. 4A illustrates an electric charge variation signal generated at the output of the sensor of FIG. 3 following a sequence of gestures of upward and downward movements of a foot by the user of the electronic device of FIG. 1.

FIG. 4A illustrates an example of the charge variation signal $S_Q$. The values of the potential difference Vd, induced by the charge variation, between the inputs 8a, 8b are represented on the ordinate axis of the charge variation signal $S_Q$. This value is expressed here in LSB ("Least Significant Bit"), i.e., the minimum digital value output from the analog-to-digital converter, which is proportional to the potential difference Vd present at the inputs 8a, 8b. Typically 1 LSB corresponds to a value ranging between a few V and a few tens of μV. The constant of proportionality (or sensitivity) depends on the gain of the amplifier, the resolution of the analog-to-digital converter and any digital processing (e.g., oversampling, decimation etc.). The representation in LSB is common in the art and disregards a quantification in physical units, since the aim is typically to detect relative variations, with respect to a steady state or base state.

The progressive numbers of the acquired sample are represented on the abscissa axis of the charge variation signal $S_Q$. The reported measurements have been made with a sampling frequency equal to 50 Hz, thus each sample is temporally spaced from the following and the previous by 20 ms.

As may be seen from FIG. 4A, the charge variation signal $S_Q$ has a plurality of peaks p1-p10 that follow each other temporally with amplitude much greater than the background noise.

Each peak p1-p10 is caused by a respective upward movement of the user's foot or downward movement of the user's foot. The peaks p1-p10 are identified in the signal Vd' (then sampled generating the signal $S_Q$), but what described here applies in an equivalent manner to the signal Vd. In fact the amplification stage (instrumentation amplifier of FIG. 2) is useful, but unnecessary. If the charge variation signal to be acquired (caused by the movement of the user) is sufficiently large or if the electrical characteristics of the analog-to-digital converter allow it (e.g., high input impedance, high resolution, full scale suitable for the signal to be converted, etc.), then this amplification stage may be omitted, and the inputs 8a and 8b are the inputs of the analog-to-digital converter.

Negative peaks p1, p3, p5, p7, p9 are generated when the user performs an upward movement of his/her foot, while positive peaks p2, p4, p6, p8, p10 are generated when the user performs a downward movement of his/her foot previously moved upward. By way of example when, starting from time 0, the user moves his/her foot upward for the first time, the negative peak p1 of the signal $S_Q$ is generated and, when the same foot is subsequently moved downward, the positive peak p2 in the signal $S_Q$ is generated. The same situation occurs for the generation of the other pairs of negative and positive peaks (foot that is moved upward: generation of p3, foot that is moved downward: generation of p4, etc.).

According to an aspect of the present invention, a sampling of the voltage Vd' is provided at a sampling rate of 50 Hz, generating the signal $S_Q$. The sampling rate is for example equal to 50 Hz, but may be different, for example chosen in the range 25 Hz-1 kHz.

Optionally, a filtering of the signal $S_Q$ is also provided, to remove or attenuate any spectral components not related to the movement to be detected. For example, it is possible to carry out a low-pass filtering to attenuate the components of the signal $S_Q$ greater than 30 Hz, in order to reduce the noise induced by the electric field of the power grid (usually to 50 Hz or 60 Hz) as much as possible.

Figure 4B:
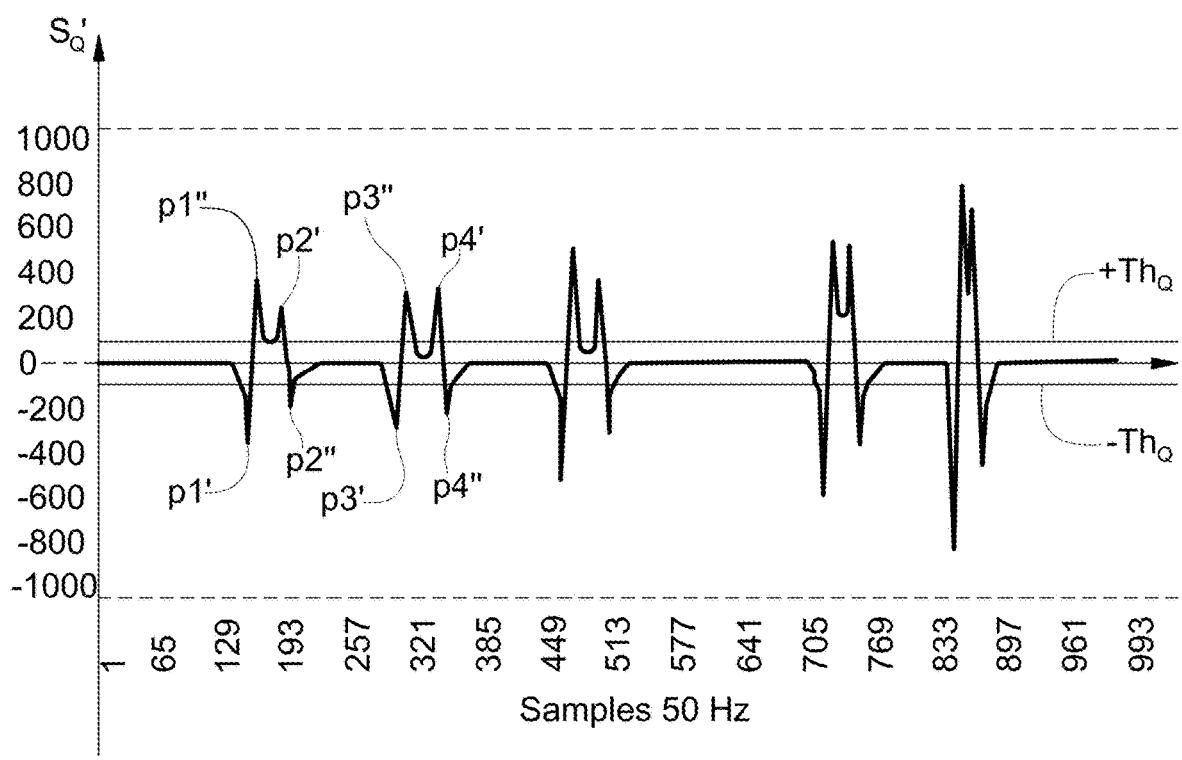
FIG. 4B illustrates the derivative function of the electric charge variation signal of FIG. 4A.

According to the present invention, parameters of interest are also extracted from the signal $S_Q$ (hereinafter, reference is made to "signal $S_Q$" to indifferently identify such signal $S_Q$ with or without filtering) which are used to detect the gestures of the user (as said, movement of the foot upward from/downward to the ground). This operation provides for calculating the derivative with respect to the time of the signal $S_Q$ (hereinafter, identified as $S_Q'$); the signal $S_Q'$ is illustrated in FIG. 4B.

In the previously illustrated embodiment, the voltage Vd' is, as said, sampled at 50 Hz. This means representing 2 seconds of the signal Vd' with N=100 samples $S_Q(1), \ldots,$ $S_Q(N)$ of the signal $S_Q$. For each sample $S_Q(1), \ldots, S_Q(N)$ of the signal $S_Q$, a derivative value is calculated (or estimated) according to a known method, for example according to the "forward difference method" which provides for calculating the difference between two consecutive samples divided by time unit.

Other methods allow the derivative to be estimated with higher accuracy and less sensitivity to noise, employing a greater number of points. In the method known as "second order central difference" it is $y_i=(x_{i+1}-x_{i-1})/2dt$, that is for estimating the value yi of the derivative y(n) of a function, at the i-th sampling step and of duration dt, it is necessary to know the values $x_{i+1}$ and $x_{i-1}$ of the function x(n), respectively at the following and previous sampling step. In the method known as "fourth order central difference" it is $y_i=(-x_{i+2}+8x_{i+1}-8x_{i-1}+x_{i-2})/12dt$: in this case there is a better estimate of the derivative, at the expense of a greater complexity of calculation and use of memory, as it is necessary to know the values of the function x(n) with 4 sampling steps.

The components of the derivative $S_Q'$ of the charge variation signal $S_Q$ which identify the execution, by the user, of the gesture to be detected, are then extracted.

To this end, a comparison by means of double threshold $\pm Th_Q$ is used to identify the components of the signal $S_Q'$ identifying the expected gesture.

In particular, the variation of the signal $S_Q$ of FIG. 4A due to the upward movement of the foot generates the negative peak p1, whose derivative over time is represented in FIG. 4B by a sequence of two peaks, of which a first negative peak p1' and then a positive peak p1"; similarly, the variation of the signal $S_Q$ of FIG. 4A due to the successive downward movement of the foot generates the positive peak p2 whose derivative over time is represented, in FIG. 4B, by a sequence of two peaks, of which a first positive peak p2' and then a negative peak p2".

In FIG. 4B, the values of the derivative calculated on the basis of the signal $S_Q$ using the same representation in LSB of FIG. 4A are represented on the ordinate axis. The derivative provides a measure of the "speed", or of the rate, with which the signal $S_Q$ varies. The progression of the acquired samples is represented on the abscissa axis of FIG. 4B, similarly to FIG. 4B.

The exceeding (towards negative values) of the threshold $-Th_Q$ by the signal $S_Q'$ (peak p1') followed by the successive exceeding (towards positive values) of the threshold $+Th_Q$ by the same signal $S_Q'$ (peak p1") is associated with the execution of an upward movement of the foot by the user. The exceeding (towards positive values) of the threshold $+Th_Q$ by the signal $S_Q'$ (peak p2') followed by the exceeding (towards negative values) of the threshold $-Th_Q$ by the same signal $S_Q'$ (peak p2") is associated with the execution of a downward movement of the foot by the user. By recognizing therefore this sequence of events in the signal $S_Q'$ it is possible to identify the expected upward and successive downward movements of the foot by the user.

Similar considerations apply to the pairs of peaks (p3', p3") and (p4', p4"), identifying the upward movement of the foot identified by peak p3 and, respectively, the downward movement of the foot identified by peak p4, and so on.

As noted from FIG. 4B, where there are no movements of the user, the signal $S_Q$ varies slightly, and is substantially constant (unless of a variation due to electrostatic noise phenomena). The derivative $S_Q'$ of the signal $S_Q$ is, in this context, substantially equal to zero (or with a mean value equal to zero). On the contrary, in the presence of the expected gesture, the derivative $S_Q'$ shows an apparent variation, with positive peaks p1", p2', and negative peaks p1', p2" with respect to the zero value. By "negative peaks" it is therefore intended variations of the signal $S_Q'$ towards negative values (smaller than the mean value that the signal $S_Q'$ assumes in the condition of absence of movement) reaching values lower than the threshold $-Th_Q$ (exceeding of the threshold $-Th_Q$ towards negative values); by "positive peaks" it is intended variations of the signal $S_Q'$ towards positive values (greater than the mean value that the signal $S_Q'$ assumes in the condition of absence of movement) reaching values higher than the threshold $+Th_Q$ (exceeding of the threshold $+Th_Q$ towards positive values).

The Applicant has also verified that other movements, such as the oscillation of the user's arm that supports the device 4 during the enabling of the functionality according to the present invention, do not generate an electrostatic charge variation having a trend, in the signals $S_Q$ and $S_Q'$, comparable to that of the upward/downward movement of the foot. In fact, the electrostatic charge variation due to the movement of the arm is much lower than, and different from that, caused by the upward movement of a foot; in fact it does not arise from an exchange of charges with the ground/floor, but from a variation of the electrostatic field, induced by the movement of the body (this effect prevails with respect to the generation or transfer of charges as a result of arm-air friction).

The thresholds $\pm Th_Q$ are, in one embodiment, of a fixed and preset type. In particular, the Applicant has verified that the signal produced by the movement of the leg is so strong with respect to the background noise of the signal $S_Q'$ (and, correspondingly, $S_Q$) that each threshold $\pm Th_Q$ may be preset to a value (in modulus) equal to 20-50 times as much as the maximum value reached by the background noise of the signal $S_Q'$, without the risk of acquiring false positives.

In one embodiment, the thresholds $\pm Th_Q$ may be defined as fixed levels, based on the full scale of the sensor (¼, ½, ¾, etc.), or may be programmed by the user (e.g., by creating a calibration routine of the "move foot upward" and "move foot downward" gestures, with a user interface asking the user to perform a certain number of repeated actions to estimate the levels of optimal threshold, as well as, possibly, of maximum time between the two events).

The thresholds $\pm Th_Q$ may be defined for example by calculating a mean and a standard deviation of the maxima (in the case of positive peaks) and the minima (in the case of negative peaks) and choosing the threshold as the mean decreased or increased (respectively for maxima or minima) by 3 times as much as the standard deviation.

By way of example, considering that the background noise of the signal $S_Q'$, when the user is substantially stationary, oscillates between values ±5 LSB, a choice of the threshold $+Th_Q$ of value 100 LSB and of the threshold $-Th_Q$ of value −100 LSB allows for distinguish between peaks actually due to the expected movements by the user and the background noise.

In a further embodiment, the threshold $\pm Th_Q$ is of adaptive type, that is, it varies according to the trend of the signal $S_Q'$. The calculation of the threshold $\pm Th_Q$ of the adaptive type may be performed exploiting techniques known in the state of the art. For example, sliding windows or overlapping windows may be used. Other techniques for real-time calculation of adaptive threshold may be used.

As discussed with reference to FIG. 2, in order to distinguish between commands actually given by the user and upward/downward movements of the foot for other reasons, it is possible, optionally, to detect a time $t_{OFF}$ elapsing between the detection of the positive peak p1" and the detection of the following positive peak p2'. The time $t_{OFF}$ is, for example, the residence time of the signal $S_Q'$ below the threshold $+Th_Q$.

If the time $t_{OFF}$ elapsing between these two peaks p1", p2' is greater than a reference time interval $\Delta T_{OFF}$, then the command (or trigger) to enable the aforementioned functionality of the device 4 is not generated; conversely, the command to enable the aforementioned functionality of the device 4 is generated.

The choice of the value of this time interval $\Delta T_{OFF}$ should take into account the speed of upward/downward movement of the foot, as the rising and falling edges of the peaks p1-p10 of the signal $S_Q$ (and, consequently, of the derivative thereof) vary according to the speed of the upward/downward movement of the foot.

Figure 5:
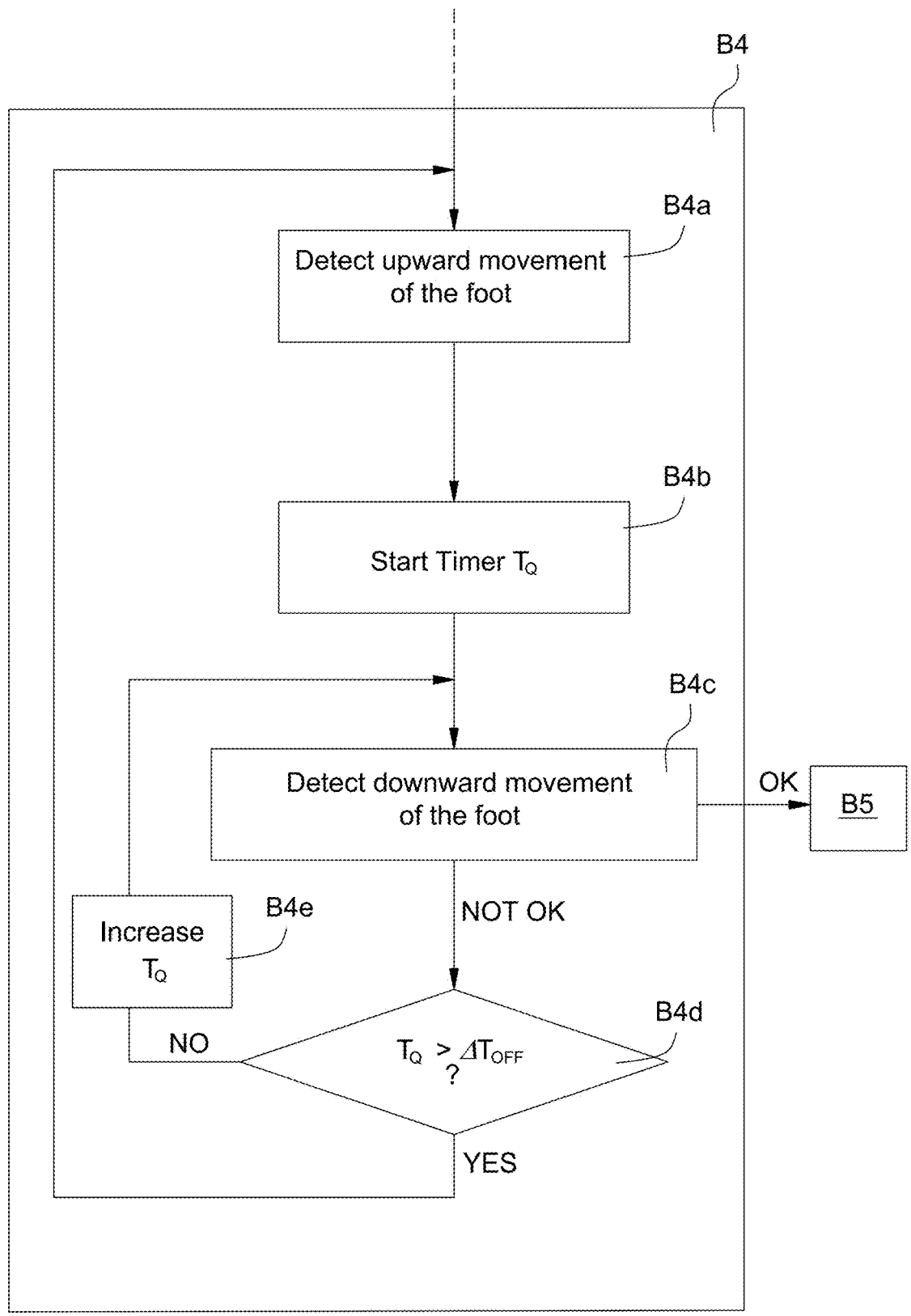
FIG. 5 illustrates, by means of a flow chart, substeps of the method of FIG. 2.

FIG. 5 illustrates, by means of a flow chart, a method for calculating and evaluating the time $t_{OFF}$ elapsing between the upward movement of the foot and the following downward movement of the foot. These steps are part of step B4 of FIG. 2.

With reference to the flowchart of FIG. 5, when the upward movement of the foot is detected at step B4a (according to the modes already described), step B4b is carried out wherein a timer $T_Q$ which counts the time elapsed from the upward movement of the foot to the following resting of the foot on the ground is started.

At each acquisition iteration, the condition of "foot resting on the ground" is assessed, step B4c: if the foot has been moved downward, the acquisition of the signal $S_Q$ of step B2 stops and step B5 of FIG. 2 (enable functionality) is carried out.

If the resting of the foot on the ground is not detected at step B4c, it is verified, at step B4d, whether the timer $T_Q$ has exceeded the predefined reference interval $\Delta T_{OFF}$ (for example 1 second, which may be set or modified by the user).

If not ($T_Q < \Delta T_{OFF}$), the timer $T_Q$ is increased (step B4e), and the method returns to step B4a, to detect the upward movement of the foot based on new samples of the signal $S_Q$ acquired.

In case the threshold of $\Delta T_{OFF}$ is exceeded (exit YES from block B4d), the method returns to step B4a.

Therefore, based on the steps of FIG. 5, it is that $t_{off}$ is the time elapsing between the instant of detection of the foot moved upward and the instant of detection of the foot moved downward.

Figure 6A:
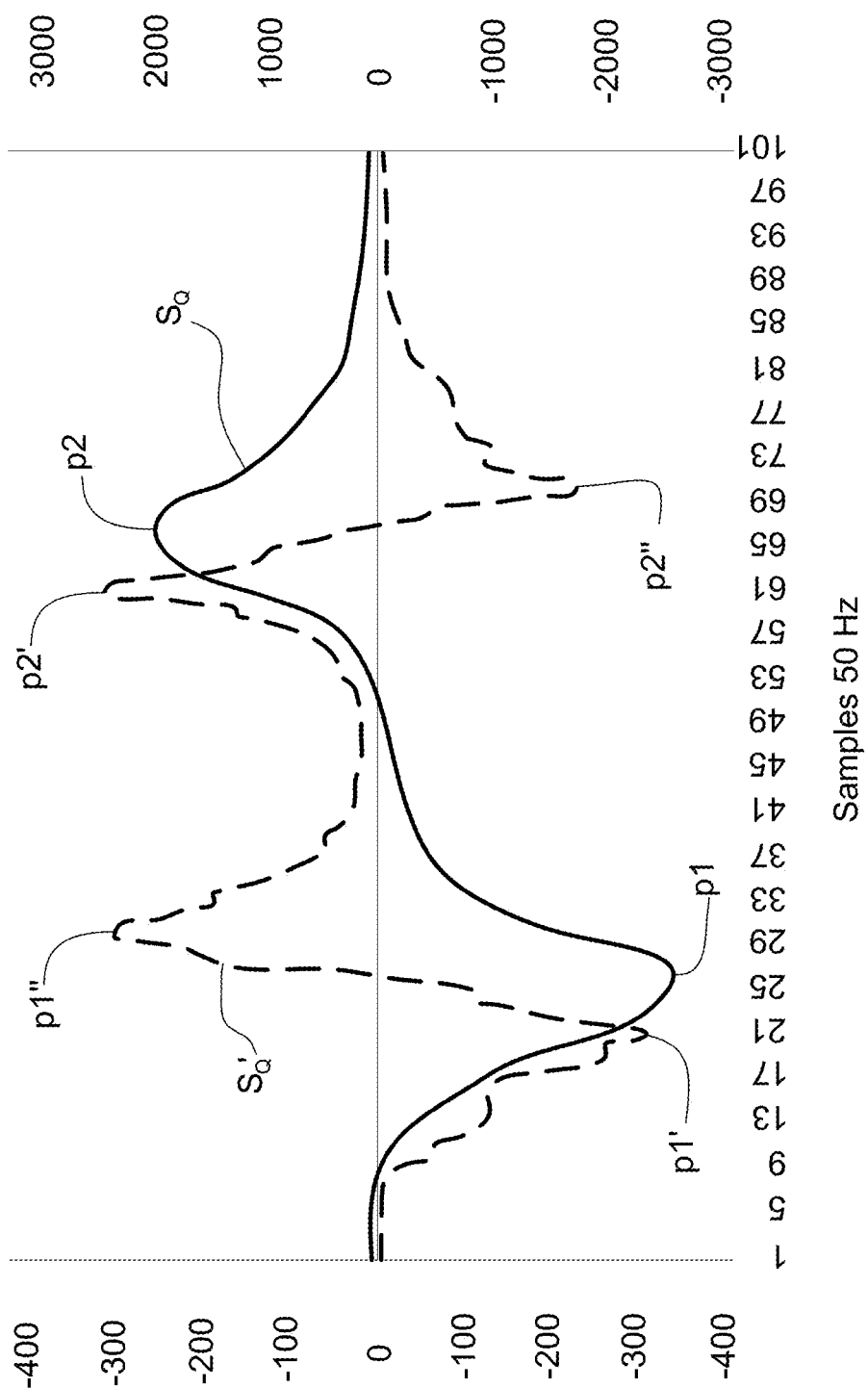
FIG. 6A exemplary illustrates the trend of the electric charge variation signal and the derivative thereof in the case of a rapid upward and downward movement of a foot by the user.

FIG. 6A exemplary illustrates the trend of the signals $S_Q$ and $S_Q'$ in the case of rapid movement, while FIG. 6B exemplary illustrates the trend of the signals $S_Q$ and $S_Q'$ in the case of slow movement. As noted, in the case of FIG. 6A the time $t_{OFF}$ is substantially less than the corresponding time $t_{OFF}$ of the situation of FIG. 6B. The applicant has however verified that the choice of a reference interval $\Delta T_{OFF}$ of a value equal to 1-2 seconds, with a threshold $+Th_Q$ equal to or greater than 100, covers most of the situations that occur in practice, managing to identify both slow and fast commands.

Finally, it is apparent that changes and variations may be made to what discussed above, without departing from the scope of the present invention.

For example, the step of detecting peaks p1-p10 by means of a threshold may be replaced by a step of recognizing the shape of the signal $S_Q$ or the signal $S_Q'$. For example, machine learning and/or artificial intelligence techniques may be used for the automatic recognition of specific patterns of the signal $S_Q$ or $S_Q'$ associated with the gesture to be detected (upward/downward movement of the leg), so as to distinguish between different types of gestures, including a step up, a step down, a foot tap on the ground, etc.

Furthermore, it is noted that a charge variation sensor of a type not wearable by the user, but configured to remotely detect electrostatic variations generated following the execution of a step by the user, may be used. A system of this type is a distributed system and may be used, for example, in gaming or augmented reality applications, wherein the user performs his/her movements in a delimited environment, for example a room.

The advantages achieved by the present invention are apparent from the preceding description.

For example, the present invention offers an opportunity of controlling a device without using the hands, which might be engaged in other purposes (for example to support the device itself). Furthermore, the present invention is not affected by the ambient brightness (critical parameter in application of facial recognition or gesture recognition according to the prior art) and is not affected by the acoustic noise (interfering in the case of voice commands). Even in the case of hands-free, the control through movement of the foot allows for not exerting pressure or movements (some unwanted) directly on the device to be controlled (key pressing, screen touching etc.) with the advantage of not altering the position, the target or the focus (in the case of a photo-camera) thereof.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A system comprising:
   an electrostatic charge variation sensor, configured to detect a variation of an electrostatic charge of a user of an electronic device during execution of a gesture by the user, and to generate a charge variation signal, wherein the gesture includes the user moving at least one foot upward and, subsequently, downward; and
   a processing unit, coupled to the electrostatic charge variation sensor, and configured to:
   acquire the charge variation signal;
   calculate a derivative function of the charge variation signal;
   detect, in the derivative function of the charge variation signal, a first characteristic identifying the gesture of moving the at least one foot upward, the first characteristic including a first negative peak temporally followed by a first positive peak;
   detect, in the derivative function of the charge variation signal, a second characteristic identifying the gesture of moving the at least one foot downward, the second characteristic including a second positive peak temporally following the first positive peak and temporally followed by a second negative peak; and
   control at least one functionality of the electronic device in response to detecting both the first and the second characteristics.

2. The system according to claim 1, wherein the processing unit configured to detect the first characteristic includes the processing unit configured to:
   define a negative comparison threshold and a positive comparison threshold for the derivative function;

identify, in the derivative function, the first negative peak having a first amplitude that exceeds the negative comparison threshold; and identify, in the derivative function, the first positive peak, having a second amplitude that exceeds the positive comparison threshold.

3. The system according to claim 2, wherein the processing unit configured to detect the second characteristic includes the processing unit configured to:

identify, in the derivative function, the second positive peak, having a third amplitude that exceeds the positive comparison threshold; and identify, in the derivative function, the second negative peak, having a fourth amplitude that exceeds the negative comparison threshold.

4. The system according to claim 3, wherein the first negative peak, the first positive peak, the second positive peak, and the second negative peak follow each other temporally in an absence of further positive and negative peaks exceeding the positive and negative comparison thresholds.

5. The system according to claim 3, wherein the positive and negative comparison thresholds are fixed thresholds preset or definable by the user.

6. The system according to claim 3, wherein the positive and negative comparison thresholds are adaptive thresholds.

7. The system according to claim 1, wherein the processing unit is further configured to process the charge variation signal using machine learning and/or artificial intelligence algorithms to detect specific patterns of the charge variation signal identifying the gestures of moving the at least one foot upward and downward.

8. The system according to claim 1, wherein the electrostatic charge variation sensor is an instrumentation amplifier comprising:

a first electrode configured to be placed in direct contact with a portion of a body of the user; and a second electrode coupled to a voltage reference terminal, wherein the charge variation signal is a function of a potential difference present, in use, between the first and second electrodes.

9. A portable electronic device, comprising:

a function unit configured to execute at least one functionality;

an electrostatic charge variation sensor, configured to:
detect a variation of an electrostatic charge of a user of the portable electronic device during execution of a gesture by the user; and
generate a charge variation signal, wherein the gesture includes the user moving at least one foot upward and, subsequently, downward; and a processing unit, coupled to the electrostatic charge variation sensor and the function unit, wherein the processing unit is configured to:
acquire the charge variation signal;
calculate a derivative function of the charge variation signal;
detect, in the derivative function of the charge variation signal, a first characteristic identifying the gesture of moving the at least one foot upward, the first characteristic including a first negative peak temporally followed by a first positive peak;
detect, in the derivative function of the charge variation signal, a second characteristic identifying the gesture of moving the at least one foot downward, the second characteristic including a second positive peak temporally following the first positive peak and temporally followed by a second negative peak; and
control the at least one functionality of the portable electronic device in response to detecting both the first and the second characteristics.

10. The portable electronic device according to claim 9, wherein the portable electronic device is a smartphone, the function unit is a camera, and the functionality is taking a photo or video.

11. The portable electronic device according to claim 9, wherein the processing unit configured to detect the first characteristic includes the processing unit configured to:

define a negative comparison threshold and a positive comparison threshold for the derivative function;

identify, in the derivative function, the first negative peak having a first amplitude that exceeds the negative comparison threshold; and identify, in the derivative function, the first positive peak, having a second amplitude that exceeds the positive comparison threshold.

12. The portable electronic device according to claim 11, wherein the processing unit configured to detect the second characteristic includes the processing unit configured to:

identify, in the derivative function, the second positive peak, having a third amplitude that exceeds the positive comparison threshold; and identify, in the derivative function, the second negative peak, having a fourth amplitude that exceeds the negative comparison threshold.

13. The portable electronic device according to claim 9, wherein the processing unit is further configured to process the charge variation signal using machine learning and/or artificial intelligence algorithms to detect specific patterns of the charge variation signal identifying the gestures of moving the at least one foot upward and downward.

14. A method comprising:

detecting an electrostatic charge variation of a user of an electronic device during an execution of a gesture by the user, the gesture including the user moving at least one foot upward and, subsequently, downward;

generating a charge variation signal in accordance with detecting the electrostatic charge variation;

calculating a derivative function of the charge variation signal;

detecting, in the derivative function of the charge variation signal, a first characteristic identifying the gesture of moving the foot upward, the first characteristic including a first negative peak temporally followed by a first positive peak;

detecting, in the derivative function of the charge variation signal, a second characteristic identifying the gesture of moving the foot downward, the second characteristic including a second positive peak temporally following the first positive peak and temporally followed by a second negative peak; and controlling at least one functionality of the electronic device in response to detecting both the first and the second characteristics.

15. The method according to claim 14, wherein the detecting the first characteristic includes:

defining a negative comparison threshold and a positive comparison threshold for the derivative function;

identifying, in the derivative function, the first negative peak having a first amplitude that exceeds the negative comparison threshold; and identifying, in the derivative function, the first positive peak, having a second amplitude that exceeds the positive comparison threshold.

16. The method according to claim 15, wherein the detecting the second characteristic includes:
   identifying, in the derivative function, the second positive peak, having a third amplitude that exceeds the positive comparison threshold; and
   identifying, in the derivative function, the second negative peak, having a fourth amplitude that exceeds the negative comparison threshold.

17. The method according to claim 16, wherein the first negative peak, the first positive peak, the second positive peak, and the second negative peak follow each other temporally in an absence of further positive and negative peaks exceeding the positive and negative comparison thresholds.

18. The method according to claim 16, wherein the positive and negative comparison thresholds are fixed thresholds preset or definable by the user.

19. The method according to claim 16, wherein the positive and negative comparison thresholds are adaptive thresholds.

20. The method according to claim 14, further comprising processing the charge variation signal using machine learning and/or artificial intelligence algorithms to detect specific patterns of the charge variation signal identifying the gestures of moving the at least one foot upward and downward.

* * * * *